United States Patent [19]

Miska

[11] Patent Number: 5,656,795
[45] Date of Patent: Aug. 12, 1997

[54] SEGMENTED SHIELDING STRUCTURE FOR CONNECTOR PANELS

[75] Inventor: Stanley R. Miska, Pittsford, N.Y.

[73] Assignee: Schlegel Corporation, Rochester, N.Y.

[21] Appl. No.: 415,627

[22] Filed: Apr. 3, 1995

[51] Int. Cl.$^6$ .................................................. H05K 9/00
[52] U.S. Cl. .................... 174/35 GC; 174/35 R; 174/35 MS
[58] Field of Search .............. 174/35 R, 35 GC, 174/35 MS; 361/816, 818; 156/502; 277/227, 228, 229, 235 R

[56] References Cited

U.S. PATENT DOCUMENTS

| | | | |
|---|---|---|---|
| 3,140,342 | 7/1964 | Ehrreich et al. | 174/35 |
| 4,201,825 | 5/1980 | Ebneth | 428/263 |
| 4,310,946 | 1/1982 | Baker et al. | 15/363 |
| 4,383,694 | 5/1983 | Fontana | 277/131 |
| 4,608,453 | 8/1986 | Baker et al. | 174/35 |
| 4,977,296 | 12/1990 | Hemming | 174/35 MS |
| 5,008,485 | 4/1991 | Kitagawa | 174/35 GC |
| 5,105,056 | 4/1992 | Hoge, Jr. et al. | 174/35 GC |
| 5,202,536 | 4/1993 | Buonanno | 174/35 GC |

OTHER PUBLICATIONS

Machine Design vol. 47, No. 19 (Aug. 7, 1975) pp. 74–77.

Primary Examiner—Bot L. Ledynh
Attorney, Agent, or Firm—Eckert Seamans Cherin & Mellott

[57] ABSTRACT

An EMI seal or gasket blocks electromagnetic radiation between electrically conductive bodies and encompasses an area using a number of adjacent segments, each generally formed as an elongated seal with a resilient core. An electrically conductive surface bears against the conductive bodies and extends at least partway around the respective segment. The segments are attached to one another along lengthwise seams, preferably using conductive tape on one of the opposite sides of the seal. The conductive surface is preferably provided by a metallized fabric affixed to a resilient foamed polymer core, which can be molded in the fabric or otherwise formed or cut and attached, e.g., adhesively. The conductive fabric or other surface material extending substantially around the segments provides more conducting paths across the gap between the conductive bodies than a non-segmented seal of comparable size, thereby improving shielding efficiency. The seal can be die cut, including cutting through the width of one or more segments, and remains intact, providing many of the benefits of both wide seals or gaskets and elongated narrow seals.

16 Claims, 6 Drawing Sheets

SEGMENTED SHIELDING STRUCTURE FOR CONNECTOR PANELS

BACKGROUND OF THE INVENTION

1. Field of the Invention

The invention relates to the field of electromagnetic shielding via conductive gaskets that bridge across openings between parts of conductive housings. According to the invention the shielding structure is defined by a plurality of resilient conductively wrapped segments, electrically coupled together by conductive tape or the like to form a gasket. The invention is particularly useful for shielding relatively large areas such as bypass panels at which input/output lines traverse the boundary of a shielded enclosure, typically via connectors. The segmented structure is such that the conductive path from a given point on the panel to a given point on the housing or other ground point, is shorter and/or lower in resistance than in a non-segmented arrangement, which improves shielding efficiency as compared to a similar gasket that is continuous rather than segmented.

2. Prior Art

To reduce problems due to alternating electromagnetic fields emanating from electronic equipment and/or due to the tendency for incident electromagnetic fields to affect sensitive circuits, a conductive barrier or shield is placed along the path of field propagation to provide a discontinuity. The conductive barrier typically is coupled electrically to a circuit ground. Part of the electromagnetic energy incident on the shield is reflected, and part of the energy induces currents in the shield. These currents are dissipated as eddy currents. The field is attenuated by the shield.

Conventional shielding typically uses the external housing of an article of electronic equipment for at least part of the shield barrier. In addition, internal shield barriers, enclosures, ground planes and the like can be provided for particular circuit elements within the enclosure. For these purposes, sheet metal materials, laminates of metal and plastic and/or conductive coatings typically form the conductive electromagnetic shield barrier.

Many modern electronic devices emit or are sensitive to electromagnetic interference or "EMI" at high frequencies. For example, computer clock and digital data signals, phase locked loops, switched mode power supplies, various radio frequency and microwave devices and the like are sources of EMI. Many such electronic circuits also are susceptible to EMI, and must be shielded in order to operate properly.

The effectiveness of a shield is a function of a number of factors including the electrical properties of the shield material (e.g., conductivity and magnetic permeability), the thickness and continuous or discontinuous nature of the shield, the frequency of the EMI, the spacing and configurations of the EMI source and the shield, etc. For shielding relatively higher frequencies, any gaps in the conductive material must be smaller to prevent leakage as compared to shielding lower frequencies.

The frequencies to be attenuated include harmonics. For a computer, for example, having a basic clock frequency of 25 to 100 MHz, significant harmonics may be present up to 900 MHz or more. Effective shielding requires a nearly continuous (i.e., gapless) shield, preferably arranged close to the source of EMI and/or close to the susceptible circuit, and made of a highly conductive material.

Typically, shielding is provided by a conductive enclosure made of thin sheet metal, metallized plastic or the like. An external housing can form a conductive shielding enclosure, and shielding subenclosures can be provided for subassemblies within the housing. Effective shielding advantageously includes conductive EMI blocking gaskets that continue the conductive barrier of a shield across any gaps or seams between conductive panels, enclosures, doors, housing elements and the like, which form portions of the shield.

Resiliently compressible conductive gasket structures are disclosed, for example, in U.S. Pat. Nos. 4,857,668—Buonanno; 5,045,635—Kaplo et al.; and 5,202,536—Buonanno, which are hereby incorporated. According to these patents, a conductive sheet material such as a woven or unwoven metalized plastic fabric is provided on a resilient compressible core of indefinite length to form an elongated linear gasket that can be placed between conductive panels to bridge any gap between them, e.g., due to discontinuities and the like. One possible conductive material is Monsanto "Flectron" nickel/copper metallized polyester fabric.

A conductive gasket as described can be formed in various cross sectional shapes, including round, rectangular and irregular shapes, and can be provided with an attachment means such as a clip or an adhesive area, to assist in mounting. Conductive gaskets can be made to the specific shape and area needed to reside between the conductive surfaces between which they are to seal, but it is generally more difficult and expensive to provide customized shapes and sizes. In addition, conductive gaskets for large sealing areas are more difficult to make than small area gaskets. As a result, relatively slender linear conductive gaskets or seals are generally mounted so as to define lines electrically connecting between conductive panels. Where an opening is to be provided, the linear seals are arranged around the perimeter of the opening.

For a conductive gasket comprising a conductive sheet on a resilient core, the core can be molded, extruded, cut from a block of resilient stock, etc. The conductive sheet can be wrapped on the core and affixed, for example, by adhesive. According to the above Buonanno patents, the core also can comprise a polymer with a foaming agent, applied as a liquid to a woven or non-woven metallized fabric that is wrapped, for example into a closed shape. The polymer expands to fill the void and as the polymer cures, it engages securely with the fabric.

Providing and wrapping a resilient core can be accomplished readily for substantially linear gaskets in round, oval, rectangular or complex cross sectional shapes that cover a small surface area. Where the surface area is larger, and particularly where the thickness between opposite surfaces is minimal, it may be difficult to form and/or wrap the gasket in a manner that provides an accurate shape and a smooth conductive covering. On the other hand, slender linear gaskets are not suitable for all EMI sealing applications, for example, where a substantial area of abutment between housing elements is to be sealed and/or when the sealed surface is discontinuous, for example, to allow clearance for connectors.

For larger areas, it would be possible to provide a pattern of linear seals to seal between the surfaces. Linear seals could be arranged around the perimeters of openings for connectors and the like, to allow clearance while sealing between the conductive panels. But this is cumbersome. A customized wide area gasket with clearance openings is possible, but this is also cumbersome and expensive to produce. What is needed is an improved means for sealing wide areas, having the ease of manufacture of a simple elongated linear seal of preferably regular shape, and the versatility and wide area coverage of a more customized shape.

According to the present invention, a large area EMI sealing gasket is provided in the form of a sheet, made by attaching a plurality of laterally adjacent elongated segments using conductive tape or the like. The sheet can be die cut to size and to provide clearance openings, including openings larger than a segment width. Moreover, whereas the segments as thereby connected provide additional and shorter paths between the sealed surfaces than a comparably sized continuous seal or gasket, the shielding efficiency of the shield is in fact improved rather than diminished, due to its segmented form.

SUMMARY OF THE INVENTION

It is an object of the invention to provide a relatively wide area EMI shielding seal or gasket that has a high shielding efficiency and is easy and inexpensive to manufacture and use.

It is also an object of the invention to provide a sheet-like gasket that is readily cut to form openings providing clearance for connectors, circuit card end plates and the like.

It is another object to apply easily manufactured elongated seal structures to sealing over a wide area that may have a complex configuration, without requiring attention to placing the elongated seal structures along edges to be sealed.

It is also an object to provide a versatile seal arrangement that can accommodate irregular shapes and surfaces as well as sealing arrangements where conductive material is to be placed in specific areas and not others.

It is a further object to facilitate accurate mounting and positioning of a sheet-like gasket.

These and other objects are accomplished by an EMI seal or gasket that blocks electromagnetic radiation between electrically conductive bodies and encompasses an area using a number of adjacent segments, each generally formed as an elongated seal with a resilient core and each preferably being substantially enclosed by an electrically conductive surface for bearing against the conductive bodies. The segments are attached to one another along lengthwise seams, preferably using conductive tape on one or both opposite sides of the gasket. The conductive surface is preferably provided by a metallized fabric affixed to a resilient foamed polymer core, which can be molded in the fabric or otherwise formed or cut and attached. The fabric extends substantially around the segments and provides more conducting paths across the gap between the conductive bodies than a non-segmented gasket of comparable size, namely wherein the conductive fabric or the like is disposed only on the outer surfaces and edges of the gasket, thereby improving shielding efficiency. The gasket can be die cut, including cutting through the width of one or more segments, and remains intact. The segments can be of uniform or different shapes, sizes and conductivity. The segmented gasket as described provides many of the benefits of both wide seals or gaskets, and elongated narrow seals, but with improved shielding effectiveness and versatility, and reduced costs.

BRIEF DESCRIPTION OF THE DRAWINGS

There are shown in the drawings certain exemplary embodiments of the invention as presently preferred. It should be understood that the invention is not limited to the embodiments disclosed as examples, and is capable of variation within the scope of the appended claims. In the drawings.

DETAILED DESCRIPTION OF THE PREFERRED EMBODIMENTS

Figure 1:
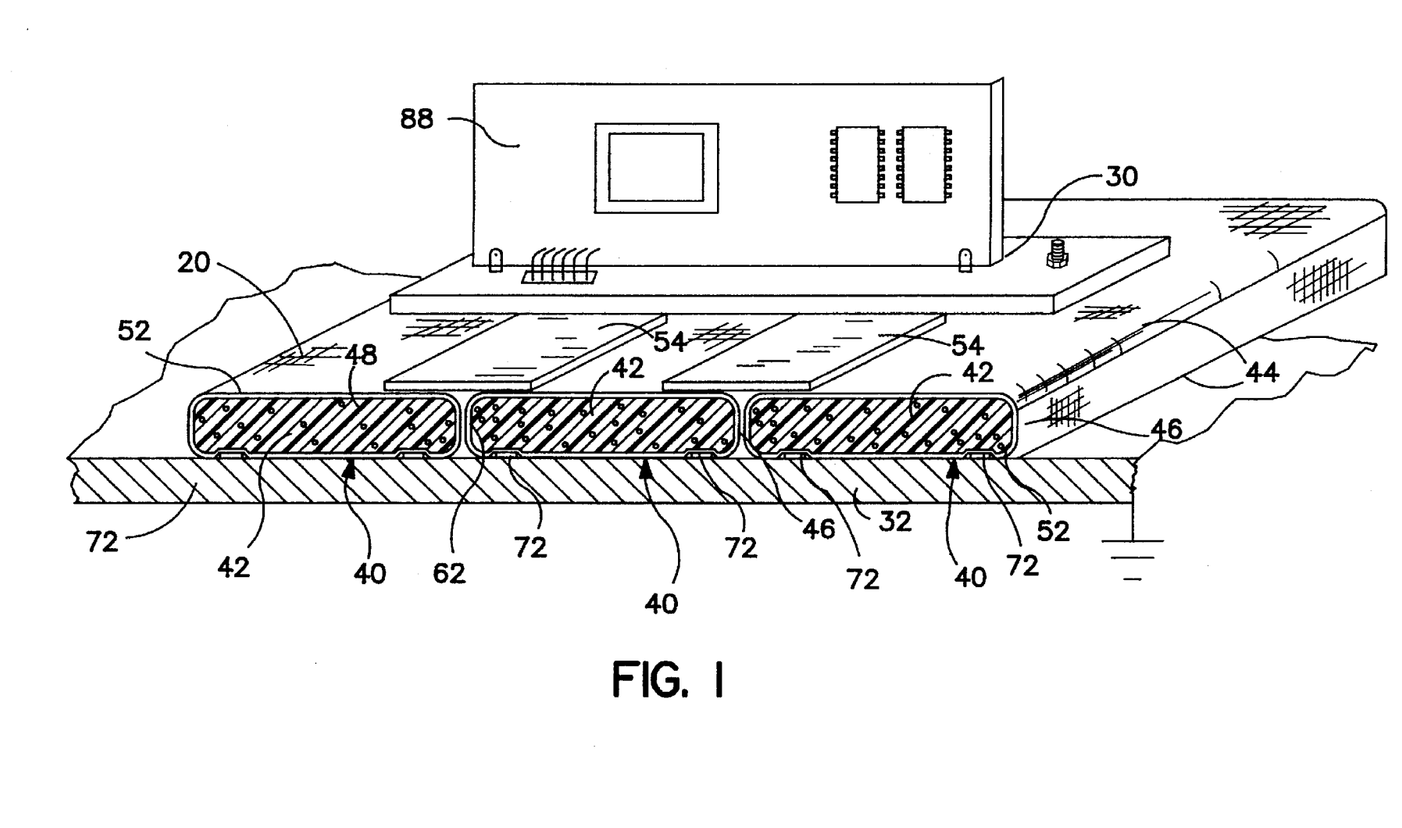
FIG. 1 is a perspective partly sectional view illustrating a segmented gasket according to the invention, for sealing between conductive bodies.
Figure 2:
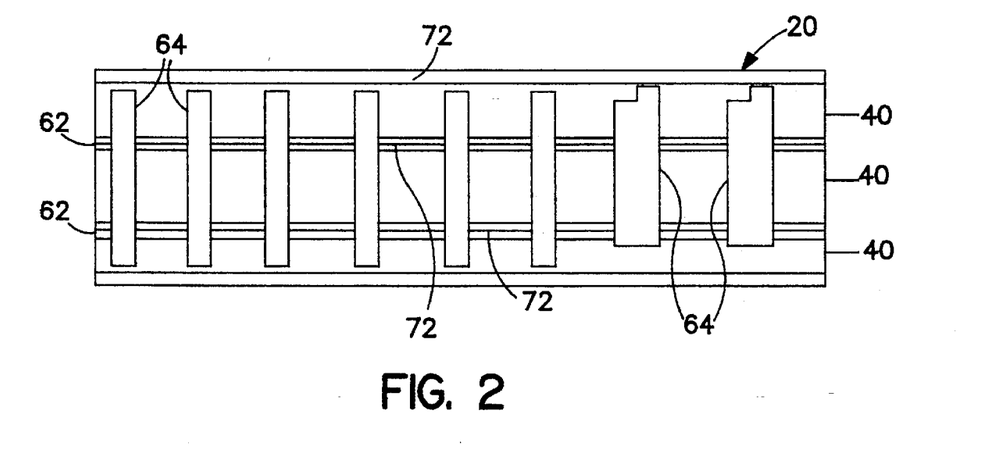
FIG. 2 is a plan view of an exemplary segmented seal or gasket as shown in FIG. 1.
Figure 3:
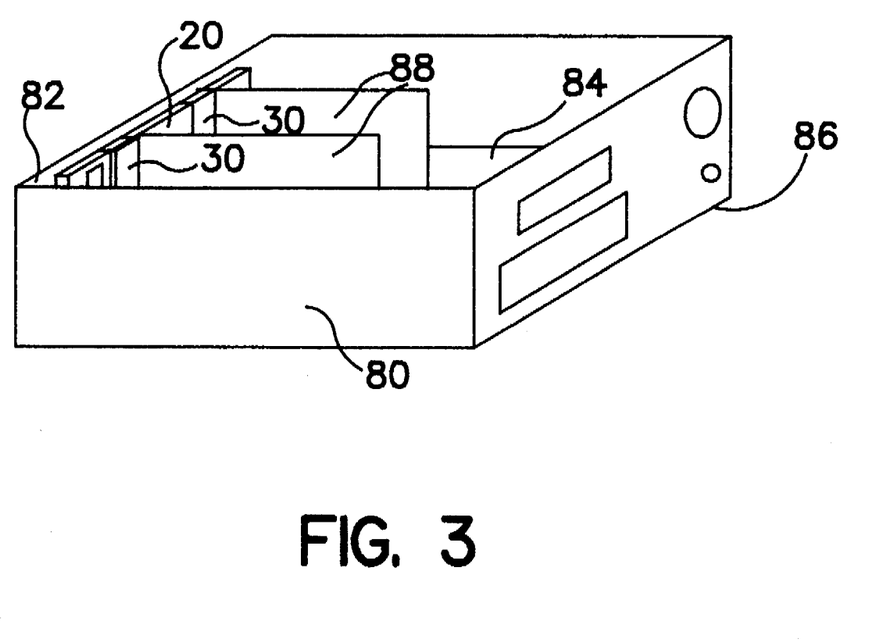
FIG. 3 is a perspective view of an exemplary housing for an electronic device, wherein the gasket seals between the external housing and circuit card end panels.

FIGS. 1–3 show an exemplary embodiment of an EMI sealing gasket 20 formed of electrically coupled elongated sealing segments according to the invention. The gasket 20 can be sandwiched between various forms of conductive panels and the like, and is shown in FIG. 1 sandwiched between the metal flange 30 of a circuit card and a conductive backplane 32 of a chassis. The gasket 20 is useful for a wide range of EMI sealing applications, and is particularly advantageous for sealing a relatively wide area between circuit elements, subenclosures, housings and other conductive bodies, wherein the area requires one or more clearance openings through the seal. At such clearance openings, as discussed in detail below, the gasket provides a conductive electrical connection between the conductive bodies, extending around the periphery of the clearance opening. This avoids the need to mount linear seals around the periphery.

Moreover, due to the segmentation of the gasket, sealing gasket 20 provides enhanced electrical coupling and improved sealing efficiency as compared to a gasket of comparable size that is not segmented. Between points on opposite sides of the segmented gasket, the conductive path passes partly along sidewalls of the segments, which would not be present in an unsegmented gasket arrangement having a conductive surface limited to its external faces and edges. Thus the path of least resistance between points on opposite sides of the gasket is shorter and comprises more conductive material than in an unsegmented gasket having an otherwise comparable structure, thereby improving the efficiency of the gasket in blocking EMI.

The gasket shown in FIG. 1 has three seal segments 40, two outer segments and a center segment. Each segment 40 has a resilient core 42 which in this embodiment is generally rectangular in cross section. The number of segments can be varied, it being preferred to use as many segments as needed to cover the required area, each segment being of a width limited to an easily produced width characteristic of linear seals, for example about 1–3 inches (2.5–7.5 cm) in width.

The seal segments 40, and gasket 20 as a whole, need only be sufficiently thick to encompass the expected variations in the width of the gap between the sealed conductive bodies 30, 32. Gasket 20 is held with some compression between bodies 30, 32, and is sufficiently resilient to conform closely to both conductive bodies. Where appropriate, for example to seal against a surface other than a flat surface such as along a ridge or groove, individual ones of the segments can have a different size, shape, width or thickness than the adjacent segment(s). It may also be appropriate to vary the thickness or width of segments between flat conductive bodies, for example providing thicker segments for higher compression and better electrical contact in some areas as opposed to others, such as along the outer borders of a gasket.

Each segment 40 has first and second contact surfaces for bearing against bodies 30, 32 on opposite sides of gasket 20. Segments 20 likewise have opposite elongated edge surfaces 46, which abut one another in the embodiment of FIG. 1, and end surfaces 48. In this embodiment, the resilient core 42 is substantially surrounded by an electrically conductive material 52 which preferably covers at least contact surfaces 44 and edge surfaces 46. Insofar as the gasket is cut through, for example along end surfaces 48 and perhaps along one or more outer ones of edge surfaces 46, resilient core 42 is exposed.

The resilient core 42 can be conductive or nonconductive and can be a rubber or a polymer, provided the core is sufficiently resilient to press the conductive covering material 52 into good electrical contact with the bodies 30, 32 to be sealed. Core 42 can be molded, extruded, cut from a block, cured in place, etc. Preferably core 42 comprises a polymer such as foamed polyurethane or the like.

The electrically conductive material 52 can comprise various forms of woven or non-woven conductive material sufficiently flexible to conform to the contour of conductive bodies 30, 32. For example, metal foil, screen, wire mesh, braided wire, woven or knitted wire, and the like, made from or incorporating metal sheet, fibers or particles, can provide a sufficiently flexible and electrically conductive surface. Preferably, covering material 52 comprises a fabric or thin batt incorporating metal fibers, metal alloy fibers or metallized synthetic fibers. Alternatively or in addition, a conductive coating can be provided in the form of a cured polymer incorporating a suspension of conductive particles, such as a colloidal suspension of conductive carbon particles, e.g., carbon black or specifically acetylene black. In a preferred embodiment, the covering material 52 comprises a woven or non-woven fabric of metallized nylon (polyamide) fibers. In a non-woven fabric, the fibers or filaments can be spunbonded or chemically bonded or heat bonded to maintain integrity, and either metallized by a plating technique or originally formed to include metal particles, fibers or filaments. In a woven fabric, Monsanto "Flectron" nickel/copper metallized polyester fabric or the like can be used as the conductive surface material 52. The primary functions of the surface material are to provide a conductive surface for engaging electrically with bodies 30, 32, and an electrical connection between opposite faces or sides 44 of segments 40.

Segments 40 are placed adjacent to one another in a coplanar configuration, preferably abutting along their narrower edges 46, and are coupled together mechanically and electrically. In the embodiment shown in FIG. 1, segments 40 are coupled in a hinge like fashion using lengths of flexible conductive tape 54, preferably applied along longitudinal seams 62. The conductive tape 54 can comprise a material similar to that of surface covering 52, for example, adhered over at least a portion of the width of the adjacent segments at each seam by a conductive adhesive or by a heat bonding technique such that the surface of gasket 20 bearing the conductive tape is substantially evenly smooth for good conformity with the respective conductive body 30, 32.

Conductive tape 54 can be applied to both opposite contact surfaces 44, but the embodiment of FIG. 1 has the segments joined together by conductive tape applied exclusively to one of the opposite contact surfaces 44. An advantage of applying conductive tape 54 to one contact surface of the adjacent segments 40 (as opposed to both) is that the two adjacent segments 40 can hinge or fold freely between the coplanar position, as shown in FIG. 1, through a 1800 range of motion until the contact surfaces of the two adjacent segments contact each other, to stack segments 40. Of course the gasket can also accommodate curves, bends or angles to any point within the range.

It is appreciated that a variety of conductive tape and segment configurations are possible. A seal can be formed with multiple segments wherein one or more adjacent segments are joined by conductive tape applied to a first of the opposite contact surfaces and one or more adjacent segments are joined by conductive tape applied to the opposite contact surfaces, alternating the direction in which the segments can be bent or folded.

Alternatively, the conductive tape can be applied to the first contact surface of one adjacent segment and the opposite contact surface of the next adjacent segment, permitting two adjacent segments to hinge or pivot in either direction. Such an arrangement is not preferred if the conductive tape is not attached along the edge surface 46 of at least one of the adjacent segments, so that the segments cannot be pulled laterally away from one another, leaving a gap. For those applications requiring maximum seal strength and rigidity, as opposed to flexibility, conductive tape can be applied to both opposite sides of the two adjacent segments. Additionally, those edge surfaces that have been cut through and where as shown in FIG. 1 the core 42 is not covered with the conductive material, can be wrapped in conductive tape to further encapsulate the resilient core and to provide additional conductive material bridging between the sealed conductive bodies.

FIG. 2 is a plan view of an exemplary embodiment of the gasket 20, from the bottom in FIG. 1, namely on the side opposite from the conductive tape 54. This gasket is suitable, for example, to seal between a conductive housing and the end flanges of circuit cards, for example metal grounded plates conventionally attached to certain types of circuit cards and including connectors for signal or power lines to traverse a shielding barrier. The gasket can be used, for example, in a computer chassis for this purpose, and in that application can be, for example, approximately 30 cm long, 13 cm wide and 0.3 cm thick. The specific dimensions of the seal of course can be varied over a wide range of sizes, shapes and/or combinations of sizes and/or shapes, to suit the application.

Referring to FIG. 2, in this embodiment the seal is formed with a plurality of clearance openings 64 which traverse the two opposite contact surfaces 44 and a portion of the resilient core 42 at each opening 64. The openings preferably are die cut after continuous segments 40 have been attached together to form a sufficient width, the die cuts forming the pattern of openings needed for a particular device, and potentially also cutting through one or both of the endmost segments to provide a gasket width that is less than an integral multiple of the segment width. The openings and the gasket width can also be formed by other methods involving curing or the assembly of short segment lengths so as to define the required clearance openings 64.

The width of the openings as shown can exceed the width of one or more segments 40 between the endmost segments, which makes that segment (the center segment in FIG. 2) discontinuous along its length. Nevertheless, the gasket 20 extends continuously around the perimeter of each clearance opening where, preferably, at least a portion of the gasket is compressed between facing surfaces of bodies 30, 32.

Adhesive strips 72 preferably are applied to at least one of the opposite contact surfaces 44 as shown in FIGS. 1 and 2, and can have pull-off film covering the adhesive until the gasket 20 is ready to install on a conductive surface of bodies 30 or 32. Alternatively, other forms of fasteners can be provided, such as holes to receive screws or rivets or the like.

The seal is particularly suitable for shielding within the chassis of an electronic device such as a digital computer, communications apparatus or the like having a plane of connectors or similar terminations that need to traverse the shield barrier, usually via shielded conductors. FIG. 3 shows how the invention can be applied to a typical personal computer chassis 80 having a backplane 82 formed with a plurality of openings which correspond one for one with a plurality of connector sockets (not shown) on the computer motherboard 84 mounted on the bottom 86 of chassis 80 for receiving circuit cards 88. This type of chassis, motherboard and circuit card configuration is well known for PC compatible personal computers, providing a series of circuit card positions that are initially closed by cover plates (not shown) and can be populated with any of various types of circuit cards 88, frequently having end flanges 30 that usually have connectors. The chassis and backplane are grounded and form a part of the shielding barrier. The gasket of the invention is advantageously placed over the backplane and continues the conductive seal barrier across any gaps between the backplane and the circuit card end flanges 30 (or perhaps the cover plates for empty circuit card positions).

Gasket 20 overlaps both the inner surface of the backplane and the rear facing surface of the circuit card flange or other conductive body 30 disposed inside of the shield barrier. The gasket 20 is preferably attached to backplane 82 via adhesives or fasteners or the like, the number, shape and position of the openings 64 in the gasket corresponding to the number, shape and position of the openings in the backplane. Returning briefly to FIG. 1, the seal is sandwiched between flange 30 and backplane 32 (or 82 in FIG. 3), the seal providing a resilient sealing surface between the flange and the backplane. In operation the seal is compressed, as shown in FIG. 4, to provide maximum electrical continuity between the seal and the flange or the seal and the backplane in the particular application.

The electrical circuitry on the motherboard and/or printed circuit cards generates varying levels of EMI. The EMI which is incident on gasket 20 is reflected or dissipated in the form of currents including conduction through gasket 20 to ground. Gasket 20 according to the invention appears to be less continuous than a comparable gasket having a single integral core of the full gasket width and a conductive surface extending continuously around the core. However, the invention is in fact characterized by shorter conductive paths and therefore lower electrical resistance between any two given points, for example on opposite sides of the gasket. Therefore, the invention has better shielding efficiency than a continuously wrapped single core of the same size and electromagnetic characteristics.

Figure 4:
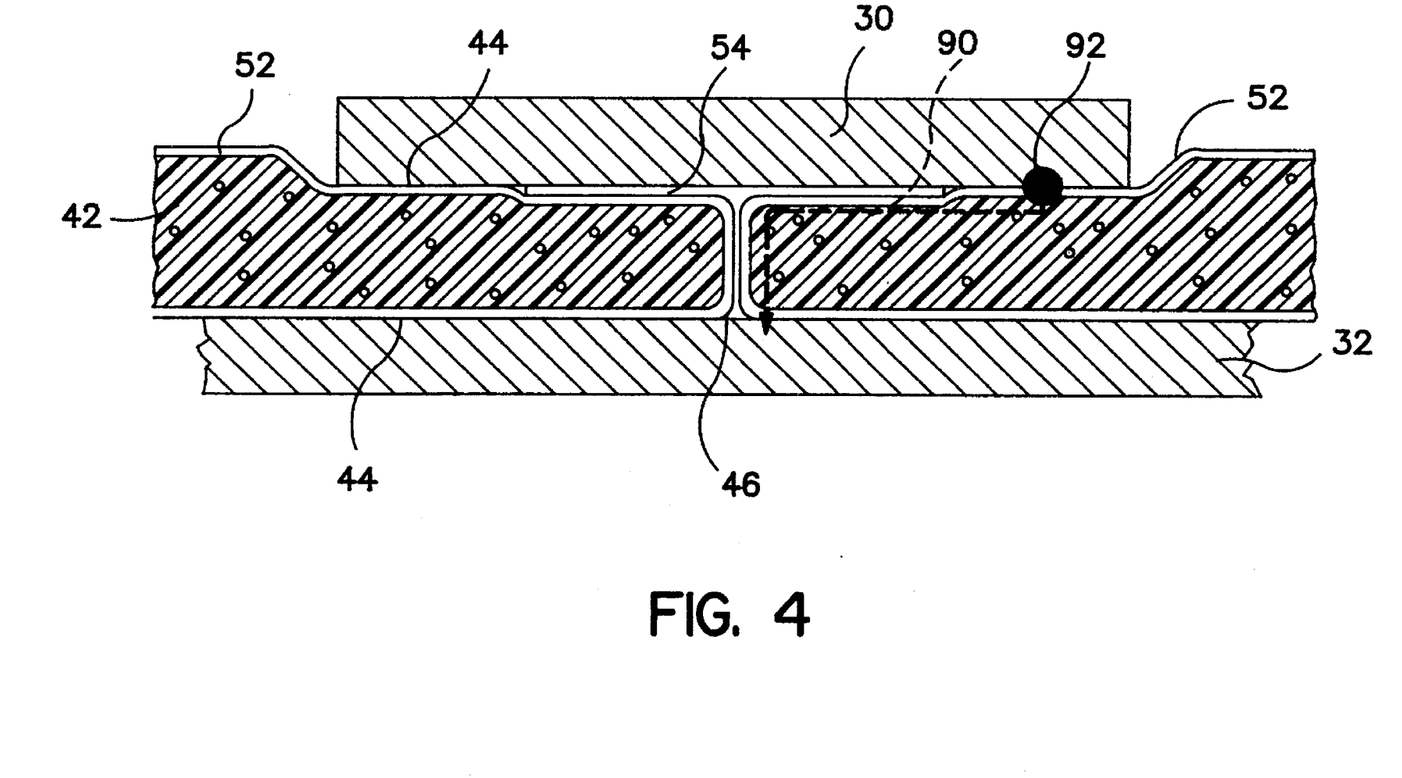
FIG. 4 is a section view through a portion of the segmented gasket according to one embodiment, taken along the line of elongation of the segments, the segments being coupled via a conductive tape.

This can be appreciated with reference to FIG. 4. A potential relative to ground induced at a given point 92 on the conductive covering 52 on the first contact surface 30 (e.g., facing the motherboard and printed circuit cards in FIG. 3) induces a current that is coupled to ground (assumed to be the chassis backplane 32 or 82) along a path (shown in a heavy broken line) through the conductive material of covering 52 to the opposite contact surface 44, which bears against the backplane. FIG. 4 is a detail view showing portions of two adjacent segments of the seal affixed between the conductive bodies, the potential being assumed to be induced on the top surface in FIG. 4 to be sinked at a ground coupled to the bottom surface. Shielding efficiency compared to non-segmented configuration is improved because the segmented structure of the seal provides shorter conductive paths for eddy currents, as shown by dotted line arrow 90, this path including along the edge surface 46 of the subject segment.

Actually, the path for the current includes all the paths that couple between the point 92 of the potential and ground, these paths effectively forming parallel electrical resistances that commonly define the resistance between the two reference points at the induced potential and at ground. Whereas the invention provides shorter and more numerous paths than a continuously wrapped arrangement in which the paths necessarily pass around the extreme edges of the gasket, the resistance is less and the shielding effectiveness of the invention is greater than in the continuously wrapped gasket.

Figure 5:
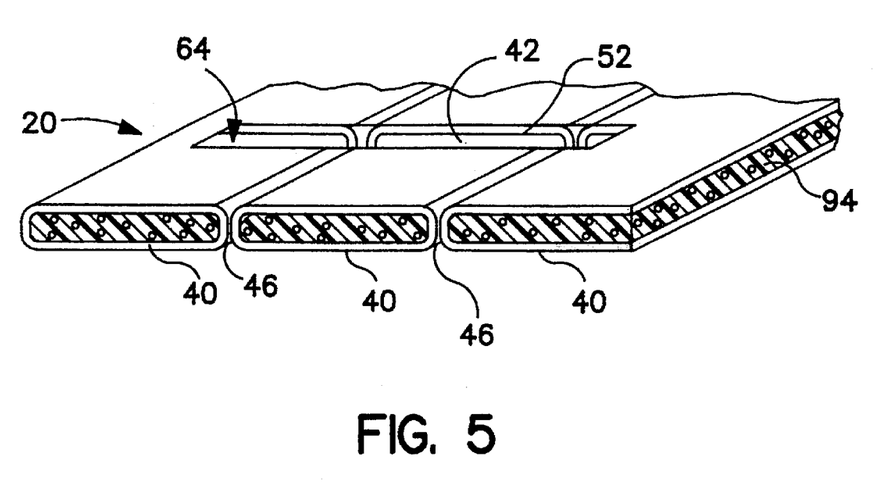
FIG. 5 is a partial perspective view of a portion of the segmented gasket according to an alternative embodiment and including clearance openings, the segments being coupled via a conductive adhesive.

FIG. 5 illustrates an alternative embodiment wherein the segmented gasket is cut not only at a clearance opening 64, but also along one edge 94, at which the conductive covering 52 has been cut away for providing the desired width of the gasket 20. According to this embodiment, a potential adjacent the cut edge represents a worst case condition wherein the path to the opposite side passes around the edge surface 46 of the associated segment. This path is longer than if the edge is not cut, but due to segmentation according to the invention, the worst case path is still, at most, a fraction of the circumference of a single segment. FIG. 5 also illustrates an embodiment wherein the conductive tape joining adjacent segments has been replaced by a conductive adhesive that holds the edges 46 of adjacent segments in abutment.

In a preferred embodiment, conductive tape 54 can be the same type of material as the conductive covering 52, such as a conductive metallized fabric. A foil, conductive polymer layer or similar structure providing a conductive material bridging over the seam is also possible, these being exemplified generally by conductive tape. The conductive tape 54 preferably is affixed to covering 52 using a conductive adhesive. The conductive adhesive has a volume conductivity and joins the conductive tape 54 to the conductive covering 52 relatively fully over the area of overlap. It is also possible to employ a nonconductive adhesive where the area and/or intimacy of conductive contact between tape 54 and covering 52 provides the necessary electrical connection.

Figure 6:
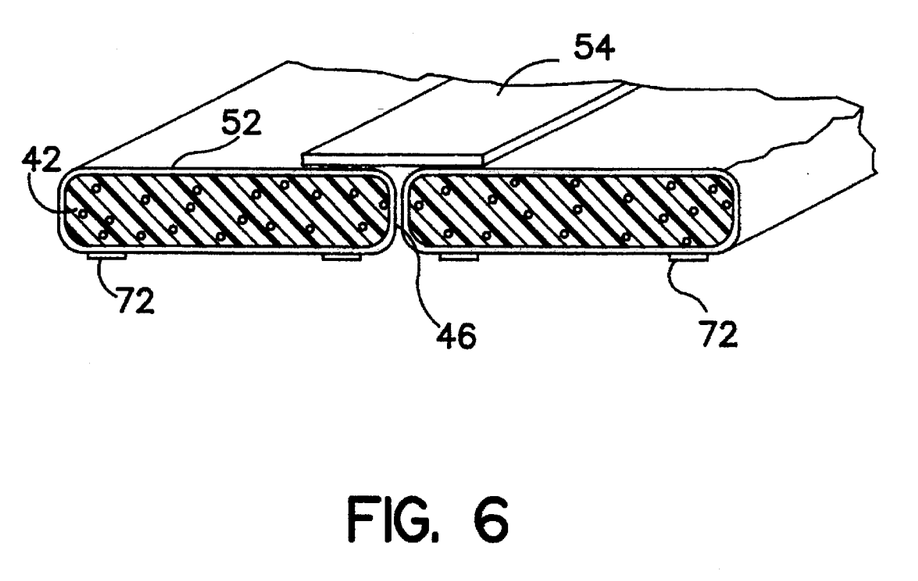
FIG. 6 is a partial perspective view showing a further alternative embodiment, including adhesive strips facilitating mounting of the segmented gasket.

A preferred arrangement of the segments is shown in FIG. 6. In this embodiment, conductive tape 54 joins over adjacent segments and holds their edges 46 against one another. The tape 54 is provided only on one side, and on the opposite side thin adhesive strips 72 are provided (see also FIGS. 1 and 2). The adhesive strips can be provided in whatever arrangement that is convenient for holding the gasket in place, at least temporarily until it is affixed by engagement between conductive bodies 30, 32. Of course other means for attaching the gasket to the bodies such as fasteners, complementary contours for receiving the gasket and the like, can be employed instead of or in addition to adhesive strips 72.

In addition to the different choices of materials and structural arrangements discussed above, the invention is subject to other variations which are apparent in view of the foregoing examples. For example, the invention is disclosed in the form of a relatively thin and flat gasket suitable for sealing between flat conductive members. The segmentation also allows the gasket to smoothly seal curves, at least on one axis of curvature parallel to the seams between segments. A two dimensional array of segments could be employed to seal around a curve in two axes, or a more complex shape. The invention could also be configured such that edges 46 having a greater dimension than the width of contact faces 44, or these two dimensions could be equal in a gasket where the segments are substantially square in cross section.

Likewise, not all the segments need to be the same size or shape. For example, the segments in certain areas can be thicker than in other areas so that the compression is greater at the thicker segments. Nor must all the segments be conductive. It is possible in certain applications to employ nonconductive segments, for example, in one or more intermediate segments, with conductive segments at the edges. Other variations are also possible.

The invention having been disclosed in connection with the foregoing variations and examples, additional variations will now be apparent to persons skilled in the art. The invention is not intended to be limited to the variations specifically mentioned, and accordingly reference should be made to the appended claims rather than the foregoing discussion of preferred examples, to assess the scope of the invention in which exclusive rights are claimed.

We claim:

1. A seal for blocking electromagnetic radiation between at least two electrically conductive bodies over an area having a length and a width, comprising:

a plurality of segments, each of the segments having a resilient core extending along at least part of one of the length and width, and means for forming an electrically conductive surface for bearing against the conductive bodies, the segments being disposed laterally adjacent to one another and being attached to one another such that the plurality of segments encompasses said area and the segments individually provide electrically parallel conductive paths through the seal and between the conductive bodies.

2. The seal of claim 1, wherein the conductive surface of each of the segments electrically couples opposite sides of the segments for bearing against the conductive bodies.

3. The seal of claim 2, further comprising electrically conductive means attaching the segments to one another.

4. The seal of claim 3, wherein the electrically conductive means attaching the segments to one another comprises at least one of a conductive tape and a conductive adhesive.

5. The seal of claim 4, wherein the electrically conductive means attaching the segments to one another comprises the conductive tape, attached on one of the opposite sides of the segments, forming seams along which the seal can be folded.

6. The seal of claim 5, wherein the conductive tape is attached on one of the opposite sides and further comprising means on an other of the opposite sides for attaching the seal to one of the conductive bodies.

7. The seal of claim 4, further comprising means on at least one of the opposite sides for attaching the seal to at least one of the conductive bodies.

8. The seal of claim 7, wherein the means for attaching the seal to the conductive bodies comprises at least one adhesive strip along each of the segments.

9. The seal of claim 4, wherein the seal is cut through to form at least one clearance opening.

10. The seal of claim 9, wherein the clearance opening has a width exceeding a width of one of the segments, such that said one of the segments is discontinuous along a length thereof in the seal.

11. The seal of claim 4, wherein the segments each comprise a resiliently compressible core having a metallized fabric sheet thereon.

12. The seal of claim 11, wherein the metallized fabric sheet comprises a metalized polymer having at least one of woven, non-woven braided and knitted material.

13. The seal of claim 11, wherein the metallized fabric sheet comprises metal fibers.

14. The seal of claim 11, wherein the metallized fabric sheet substantially surrounds the core of at least one of the segments.

15. The seal of claim 11, wherein the core comprises a foamed polymer to which the metallized fabric sheet is attached.

16. The seal of claim 15, wherein the foamed polymer is one of molded in the metallized fabric sheet and fixedly attached to the metallized fabric sheet.

* * * * *